(12) United States Patent  
Asao et al.

(10) Patent No.: US 8,111,540 B2  
(45) Date of Patent: Feb. 7, 2012

(54) SEMICONDUCTOR MEMORY DEVICE

(75) Inventors: Yoshiaki Asao, Sagamihara (JP); Takeshi Kajiyama, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/559,335

(22) Filed: Sep. 14, 2009

(65) Prior Publication Data

US 2010/0103718 A1    Apr. 29, 2010

(30) Foreign Application Priority Data

Oct. 23, 2008   (JP) ................................. 2008-273275

(51) Int. Cl.
- G11C 5/06 (2006.01)
- G11C 5/02 (2006.01)
- G11C 11/00 (2006.01)
- G11C 11/02 (2006.01)
- G11C 11/14 (2006.01)
- G11C 11/15 (2006.01)

(52) U.S. Cl. .......... 365/148; 365/158; 365/163; 365/51; 365/63; 365/72; 365/171; 365/173

(58) Field of Classification Search .................. 365/148, 365/158, 163, 171, 173, 51, 63, 72
See application file for complete search history.

(56) References Cited

U.S. PATENT DOCUMENTS

| | | | |
|---|---|---|---|
| 7,745,894 B2 | 6/2010 | Asao et al. | |
| 7,755,077 B2 | 7/2010 | Inaba | |
| 7,813,159 B2 | 10/2010 | Inaba | |
| 2002/0136053 A1* | 9/2002 | Asano et al. | 365/158 |
| 2006/0256611 A1* | 11/2006 | Bednorz et al. | 365/158 |
| 2008/0205124 A1 | 8/2008 | Inaba | |
| 2008/0308887 A1 | 12/2008 | Asao et al. | |
| 2009/0014703 A1 | 1/2009 | Inaba | |
| 2010/0237321 A1 | 9/2010 | Inaba | |

FOREIGN PATENT DOCUMENTS

| | | |
|---|---|---|
| JP | 2005-032349 | 2/2005 |
| JP | 2008-130995 | 6/2008 |
| JP | 2008-192990 | 8/2008 |
| JP | 2008-192990 A | 8/2008 |
| JP | 2008-198317 | 8/2008 |

OTHER PUBLICATIONS

Explanation of Non-English Language Reference.

* cited by examiner

Primary Examiner — J. H. Hur  
(74) Attorney, Agent, or Firm — Knobbe Martens Olson & Bear, LLP

(57) ABSTRACT

A semiconductor memory device includes first and second bit line provided in the same level layer above a semiconductor substrate, a first variable-resistance element disposed under the first bit line, having one terminal connected to one end of a current path of a first MOSFET, a second variable-resistance element disposed under the second bit line, and having one terminal connected to one end of a current path of a second MOSFET, a first interconnect layer connecting the first bit line to the other terminal of the first variable-resistance element, and connecting the first bit line to the other end of the current path of the second MOSFET, and a second interconnect layer connecting the second bit line to the other terminal of the second variable-resistance element, and connecting the second bit line to the other end of the current path of the first MOSFET.

18 Claims, 5 Drawing Sheets

Parallel state (low-resistance)　　　　Anti-parallel state (high-resistance)

(a)　　　　　　　　　　　　　　(b)

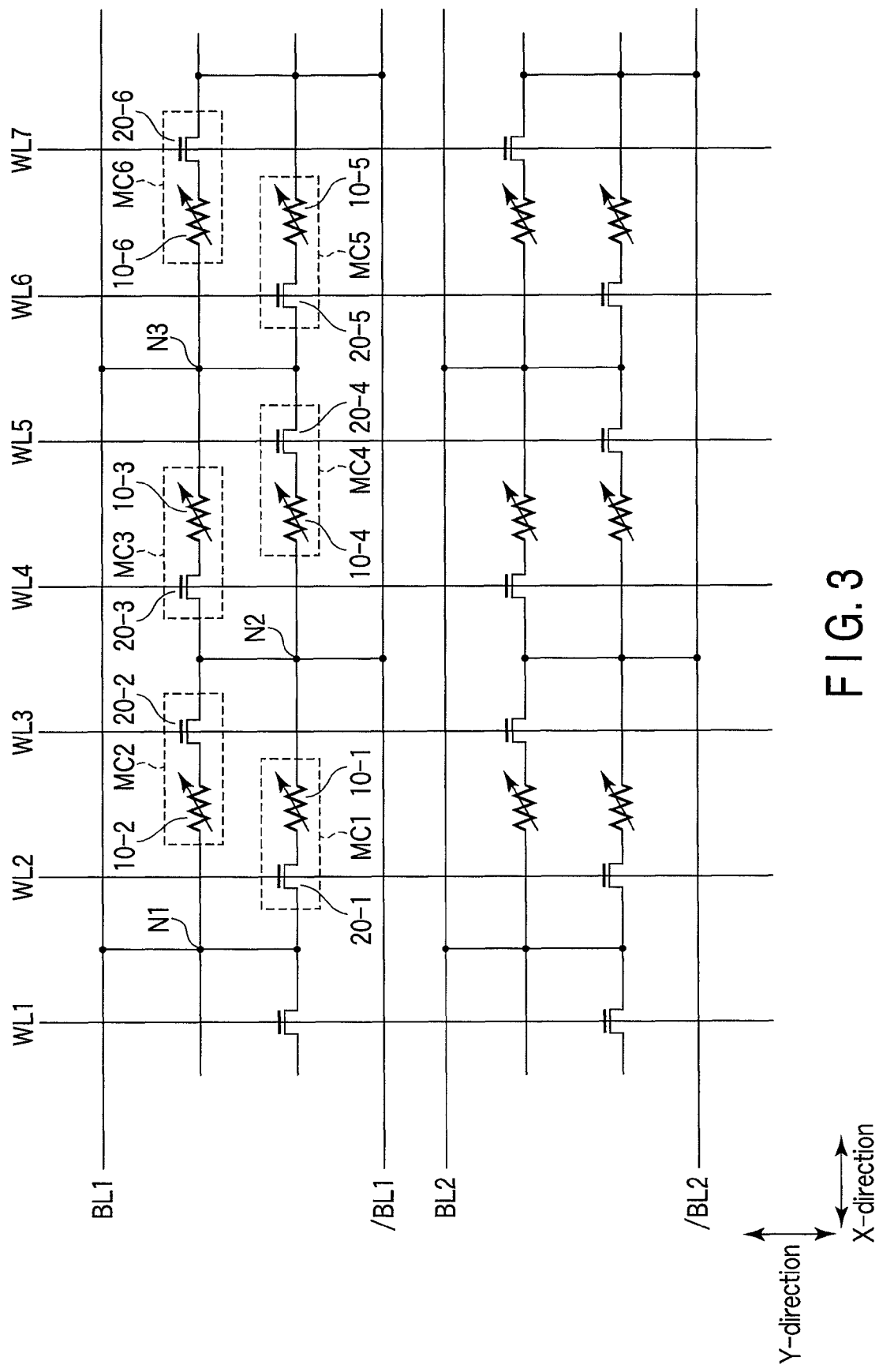
F I G. 3

SEMICONDUCTOR MEMORY DEVICE

CROSS-REFERENCE TO RELATED APPLICATIONS

This application is based upon and claims the benefit of priority from prior Japanese Patent Application No. 2008-273275, filed Oct. 23, 2008, the entire contents of which are incorporated herein by reference.

BACKGROUND OF THE INVENTION

1. Field of the Invention

The present invention relates to a semiconductor memory device which uses variable-resistance elements in memory cells to write a binary digit by a current flowing through the variable-resistance element.

2. Description of the Related Art

In recent years, much attention has been paid to semiconductor memories using variable-resistance elements as memory elements, for example, a phase-change random access memory (PCRAM) and a magnetic random access memory (MRAM), and they have been developed. The MRAM is a device in which binary digits are stored in memory cells by using the magnetoresistive effect to perform a memory operation, and has combined features of non-volatility, high speed operation, high integration and high reliability. Therefore, an SRAM, a pseudo-SRAM (PSRAM), DRAM or the like is positioned as one of the candidates of replaceable memory devices.

A large number of MRAMs each using elements indicating the tunneling magnetoresistive (TMR) effect among the magnetoresistive effects have been reported. As the TMR effect element, a magnetic tunnel junction (MTJ) element is usually used which has a laminated structure constituted of two ferromagnetic layers and a nonmagnetic layer sandwiched between these layers and which uses the change of a magnetic resistance due to a spin polarization tunnel effect. The MTJ element can take a low-resistance state and a high-resistance state in accordance with the magnetization arrangement of the two ferromagnetic layers. The low-resistance state is defined as binary 0, and the high-resistance state is defined as binary 1, whereby one binary digit can be recorded in the MTJ element.

Writing to the MRAM can be accomplished by, for example, supplying a write current to the MTJ element, whereby in accordance with the direction of this write current, the magnetization arrangement of the MTJ elements is changed from a parallel state to an anti-parallel state, or from the anti-parallel state to the parallel state. For example, a usual 1Tr+1MTJ type memory cell takes a connecting constitution in which one terminal of the MTJ element is connected to a first bit line, the other terminal of the MTJ element is connected to one source/drain region of a select transistor, and the other source/drain region of the select transistor is connected to a second bit line.

There has been disclosed a technology where, in the MRAM having such a constitution, the connection between an active area formed under the first bit line and the second bit line is achieved by extending the active area (Jpn. Pat. Appln. KOKAI Publication No. 2008-192990). However, the active area has a high sheet resistance, and hence the parasitic resistance of the MTJ element increases. Consequently, the read margin might be reduced.

BRIEF SUMMARY OF THE INVENTION

According to an aspect of the present invention, there is provided a semiconductor memory device comprising: a first bit line and a second bit line provided in the same level layer above a semiconductor substrate, and extending in a first direction so as to be adjacent to each other; a first MOSFET provided on the semiconductor substrate and disposed under the first bit line; a second MOSFET provided on the semiconductor substrate and disposed under the second bit line; a first variable-resistance element disposed under the first bit line, having one terminal electrically connected to one end of a current path of the first MOSFET, and having a resistance which changes according to stored data; a second variable-resistance element disposed under the second bit line, and having one terminal electrically connected to one end of a current path of the second MOSFET; a first interconnect layer provided on the first variable-resistance element, electrically connecting the first bit line to the other terminal of the first variable-resistance element, and electrically connecting the first bit line to the other end of the current path of the second MOSFET; and a second interconnect layer provided on the second variable-resistance element, electrically connecting the second bit line to the other terminal of the second variable-resistance element, and electrically connecting the second bit line to the other end of the current path of the first MOSFET.

BRIEF DESCRIPTION OF THE SEVERAL VIEWS OF THE DRAWINGS

FIG. 3 is an equivalent circuit diagram of an MRAM according to the present embodiment;

DETAILED DESCRIPTION OF THE INVENTION

Figure 1:
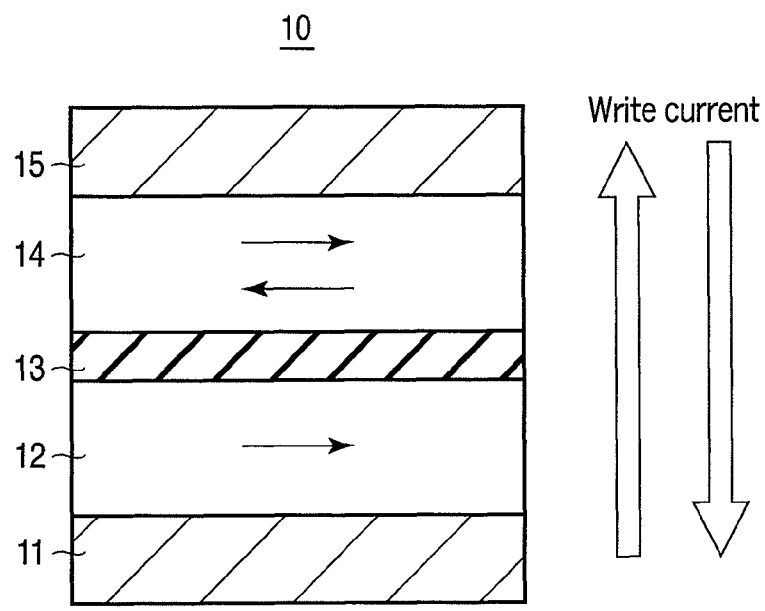
FIG. 1 is a sectional view showing the constitution of an MTJ element 10 according to one embodiment of the present invention.

The embodiments of the present invention will be described hereinafter with reference to the accompanying drawings. In the description which follows, the same or functionally equivalent elements are denoted by the same reference numerals, to thereby simplify the description.

As resistance-change memories, there can be used various types of memories such as a magnetic random access memory (MRAM), a resistive random access memory (ReRAM) and a phase-change random access memory (PCRAM). In the present embodiment, the MRAM will be described as one example of the resistance-change memory. The MRAM includes, as a memory element, a magnetic tunnel junction (MTJ) element using the tunneling magnetoresistive (TMR) effect, and stores a binary digit in accordance with the magnetized state of this MTJ element.

[1. Constitution of Variable-Resistance Element]

FIG. 1 is a sectional view showing a constitution of one variable-resistance element (MTJ element) 10 included in an MRAM according to one embodiment of the present invention.

The MTJ element 10 has a laminated structure in which a lower electrode 11, a fixed layer (also referred to as the reference layer) 12, an intermediate layer (nonmagnetic layer) 13, a recording layer (also referred to as the free layer) 14 and an upper electrode 15 are laminated in that order. The upper electrode 15 also has a function of a hard mask layer. It should be noted that the laminating order of the fixed layer 12 and the recording layer 14 may be reversed.

The recording layer 14 has a variable (reversing) direction of magnetization (or spin). The fixed layer 12 has an invariable (fixed) direction of magnetization. Describing the direction of magnetization of the fixed layer 12 as being invariable means that when a magnetization reversing current for reversing the direction of magnetization of the recording layer 14 is supplied to the fixed layer 12, the direction of magnetization of the fixed layer 12 does not change. Therefore, in the MTJ element 10, when as the fixed layer 12, a magnetic layer having a large reversing current is used and as the recording layer 14, a magnetic layer having a reversing current smaller than that of the fixed layer 12 is used, it is possible to realize the MTJ element 10 including the recording layer 14 having a variable direction of magnetization and the fixed layer 12 having an invariable direction of magnetization. When the magnetization reversing is caused by spin polarization electrons, the reversing current is proportional to a damping constant, an anisotropic magnetic field and a volume, and hence these factors can appropriately be regulated to make a difference between the reversing currents of the recording layer 14 and the fixed layer 12. Moreover, as a method for fixing the magnetization of the fixed layer 12, an antiferromagnetic layer (not shown) is provided adjacent to the fixed layer 12, and the direction of magnetization of the fixed layer 12 can be fixed by the exchange coupling between the fixed layer 12 and the antiferromagnetic layer.

The easy directions of magnetization of the recording layer 14 and the fixed layer 12 may be perpendicular to a film (or laminate) surface (hereinafter referred to as the perpendicular magnetization) or may be parallel to the film surface (hereinafter referred to as the in-plane magnetization). The perpendicular magnetization magnetic layer has a magnetic anisotropy in the perpendicular direction with respect to the film surface, and the in-plane magnetization magnetic layer has a magnetic anisotropy in an in-plane direction. When the perpendicular magnetization type is used, an element shape does not have to be controlled to determine the direction of magnetization as in the in-plane magnetization type, and this type is advantageously suitable for miniaturization.

There is no special restriction on the planar shape of the MTJ element 10, and any shape, for example, a circle, ellipse, square or rectangle may be used. Moreover, a square or rectangle having rounded or beveled corners may be used.

The recording layer 14 and the fixed layer 12 consist of a magnetic material having a high coercive force, and preferably specifically have a magnetically anisotropic energy density of $1 \times 10^6$ erg/cc or more. The intermediate layer 13 consists of a nonmagnetic material, and specifically, an insulator, a semiconductor, a metal or the like may be used. When the insulator or the semiconductor is used in the intermediate layer 13, this layer is referred to as a tunnel barrier layer.

It should be noted that each of the fixed layer 12 and the recording layer 14 is not limited to a single layer as shown in the drawing, and may have a laminated structure constituted of a plurality of ferromagnetic layers. Moreover, each of the fixed layer 12 and the recording layer 14 is constituted of three layers of a first ferromagnetic layer/a nonmagnetic layer/a second ferromagnetic layer, and may have an antiferromagnetic coupling structure in which magnetic coupling (exchange coupling) is provided so that the directions of magnetization of the first and second ferromagnetic layers have an anti-parallel state, or may have a ferromagnetic coupling structure in which the magnetic coupling (exchange coupling) is provided so that the directions of magnetization of the first and second ferromagnetic layers have a parallel state.

Moreover, the MTJ element 10 may have a double-junction structure. The MTJ element 10 having the double-junction structure has a laminated structure in which a first fixed layer, a first intermediate layer, a recording layer, a second intermediate layer and a second fixed layer are laminated in that order. Such a double-junction structure has an advantage that the magnetization reversing of the recording layer 14 by spin injection can easily be controlled.

Figure 2:
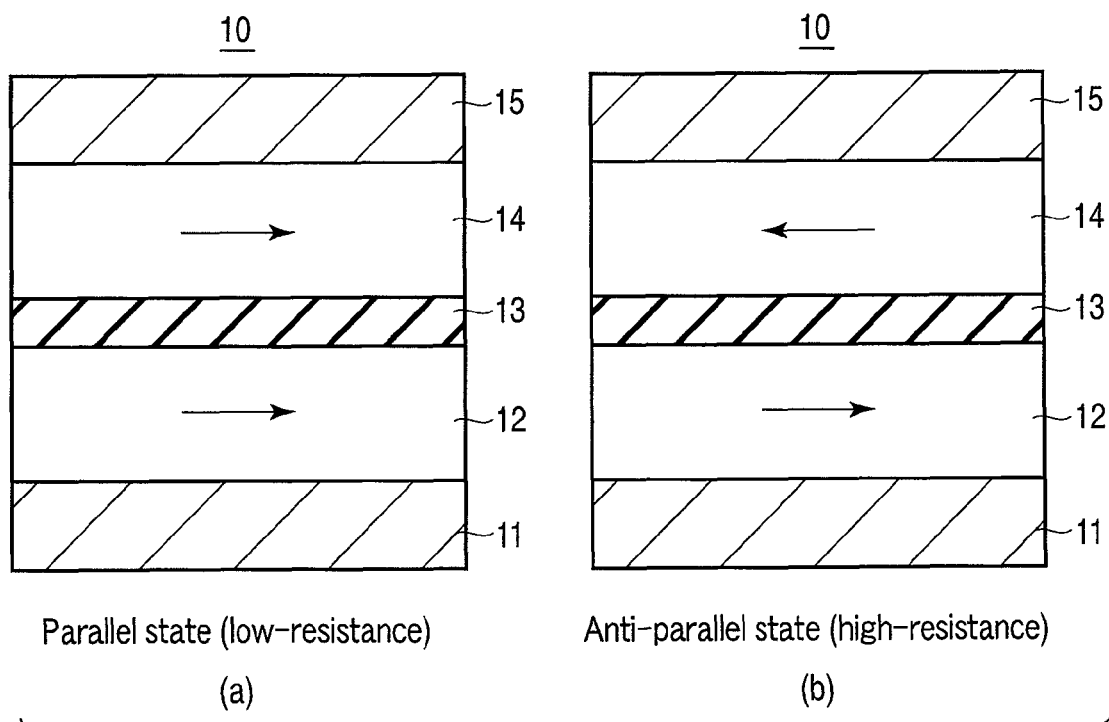
FIG. 2 is a diagram for explaining the low-resistance state and high-resistance state of the MTJ element 10.

FIGS. 2(a) and (b) are diagrams for explaining the low-resistance state and high-resistance state of the MTJ element 10, respectively. Hereinafter, the low-resistance state and high-resistance state of the MTJ element 10 by a spin-injection write system will be described. It should be noted that in this description, a current is the flow of electrons.

First, the parallel (low-resistance) state will be described in which the directions of magnetization of the fixed layer 12 and the recording layer 14 are parallel. In this case, a current flowing from the fixed layer 12 to the recording layer 14 is supplied. Majority electrons among electrons passed through the fixed layer 12 have spins parallel to the direction of magnetization of the fixed layer 12. The spin angular momentum of the majority electrons moves to the recording layer 14, whereby a spin torque is applied to the recording layer 14, and the direction of magnetization of the recording layer 14 is aligned in parallel with that of the fixed layer 12. In this parallel arrangement, the resistance of the MTJ element 10 becomes least, and this case is defined as binary 0.

Next, the anti-parallel (high-resistance) state will be described in which the directions of magnetization of the fixed layer 12 and the recording layer 14 are anti-parallel. In this case, a current flowing from the recording layer 14 to the fixed layer 12 is supplied. Majority electrons among electrons reflected by the fixed layer 12 have spins anti-parallel with respect to the direction of magnetization of the fixed layer 12. The spin angular momentum of the majority electrons moves to the recording layer 14, whereby a spin torque is applied to the recording layer 14, and the direction of magnetization of the recording layer 14 is aligned in the anti-parallel state with respect to the direction of magnetization of the fixed layer 12. In this anti-parallel arrangement, the resistance of the MTJ element 10 becomes greatest, and this case is defined as binary 1.

The binary digit is read by supplying a read current to the MTJ element 10. A value defined by "(R1−R0)/R0" will be referred to as the magnetoresistive ratio (MR ratio), in which R0 is the resistance in the parallel state, and R1 is the resistance in the anti-parallel state. The magnetoresistive ratio varies in accordance with the material or process conditions of the MTJ element 10, but can take a value of about several 10% to several 100%. The magnitude of the read current due to this magnetoresistive ratio is detected to read a binary digit stored in the MTJ element 10. The read current supplied to the MTJ element 10 during the read operation is set sufficiently smaller than the current for reversing the magnetization of the recording layer 14 by the spin injection.

[2. Circuit Constitution of MRAM]

FIG. 3 is an equivalent circuit diagram of the MRAM according to the present embodiment. The MRAM includes a plurality of memory cells MC arranged in a matrix manner.

In a memory cell array, a plurality of first bit lines BL extending in an X-direction and a plurality of second bit lines /BL extending in the X-direction are arranged. The plurality of first bit lines BL and the plurality of second bit lines /BL are alternately arranged, and one first bit line BL and one second bit line /BL adjacent to the first bit line form a pair. FIG. 3 shows two pairs of bit lines BL1 and BL2 and /BL1 and /BL2 as one example. Moreover, in the memory cell array, a plurality of word lines WL extending in a Y-direction are arranged. FIG. 3 shows seven word lines WL1 to WL7 as one example.

Each memory cell MC is of a so-called 1Tr+1MTJ type constituted of one select transistor 20 and one MTJ element 10. The select transistor 20 is, for example, an N-channel metal oxide semiconductor field-effect transistor (MOSFET).

Specifically, a memory cell MC1 is constituted of an MTJ element 10-1 and a MOSFET 20-1, one terminal of the MTJ element 10-1 is electrically connected to the bit line /BL1, the other terminal of the MTJ element 10-1 is electrically connected to one end of a current path of the MOSFET 20-1, the other end of the current path of the MOSFET 20-1 is electrically connected to the bit line BL1, and a gate of the MOSFET 20-1 is electrically connected to the word line WL2.

A memory cell MC2 is constituted of an MTJ element 10-2 and a MOSFET 20-2, and the MTJ element 10-2 is disposed adjacent to the MTJ element 10-1 in the Y-direction. One terminal of the MTJ element 10-2 is electrically connected to the bit line BL1, the other terminal of the MTJ element 10-2 is electrically connected to one end of a current path of the MOSFET 20-2, the other end of the current path of the MOSFET 20-2 is electrically connected to the bit line /BL1, and a gate of the MOSFET 20-2 is electrically connected to the word line WL3. Thus, the memory cells MC1 and MC2 having the MTJ elements adjacent to each other in the Y-direction have a reversed connecting relation between the bit lines BL1 and /BL1.

A memory cell MC3 is constituted of an MTJ element 10-3 and a MOSFET 20-3, and the MOSFET 20-3 is disposed adjacent to the MOSFET 20-2 included in the memory cell MC2 in the X-direction. Moreover, one end of the current path of the MOSFET 20-2 is electrically connected to one end of a current path of the MOSFET 20-3.

A memory cell MC4 is constituted of an MTJ element 10-4 and a MOSFET 20-4, and the MTJ element 10-4 is disposed adjacent to the MTJ element 10-1 included in the memory cell MC1 in the X-direction. Moreover, one terminal of the MTJ element 10-1 is electrically connected to one terminal of the MTJ element 10-4.

Here, the one terminal of the MTJ element 10-1, the other end of the current path of the MOSFET 20-2, the other end of the current path of the MOSFET 20-3 and the one terminal of the MTJ element 10-4 are once connected to a connection node N2, and then electrically connected to the bit line /BL1. A reason for such a connecting relation will be described later in the paragraphs of the structure of the MRAM. It should be noted that a memory cell array included in the pair of bit lines BL2, /BL2 is the repetition of the memory cell array included in the pair of the bit lines BL1, /BL1.

[3. Structure of MRAM]

Figure 4:
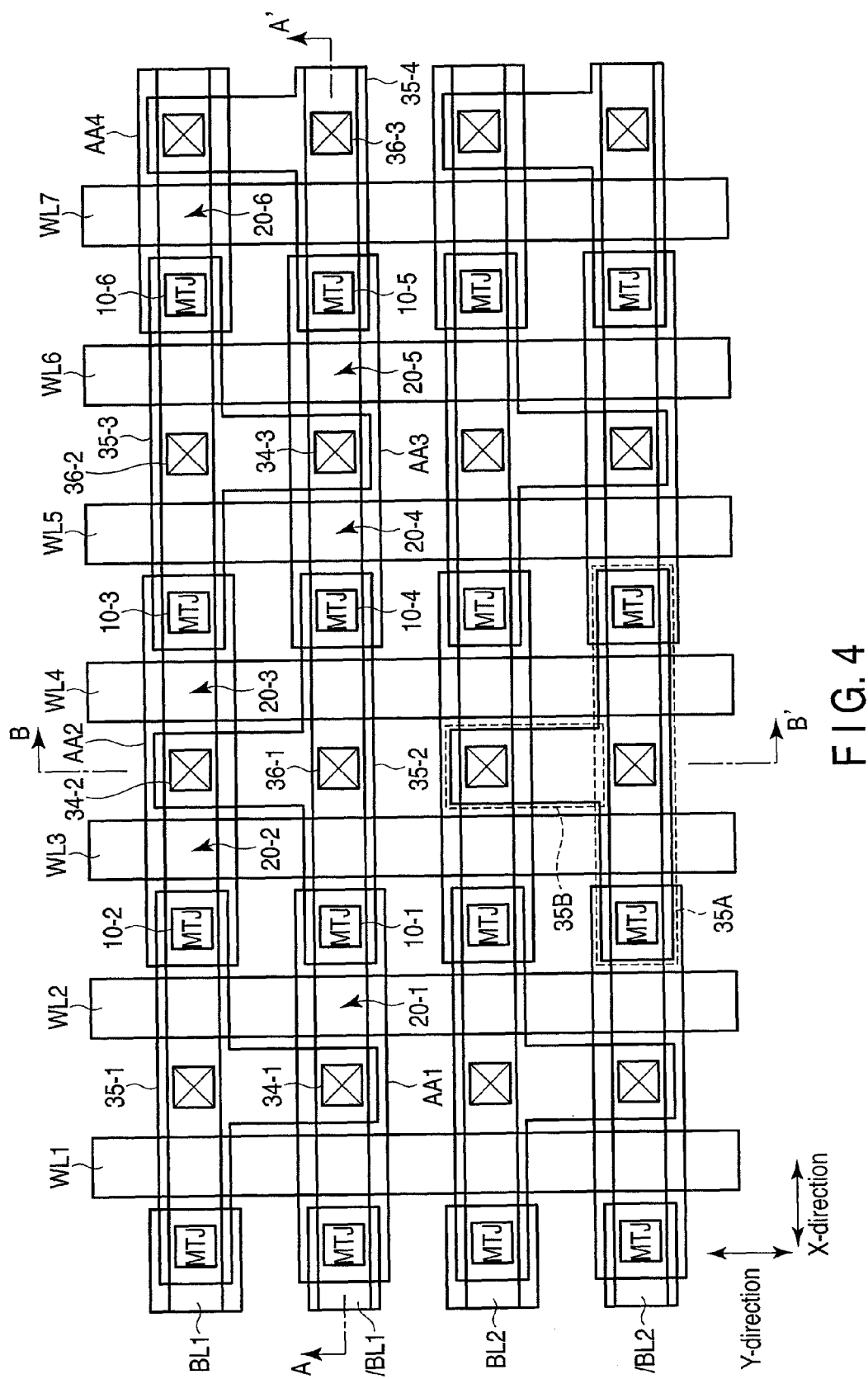
FIG. 4 is a layout diagram showing the structure of the MRAM according to the present embodiment.
Figure 5:
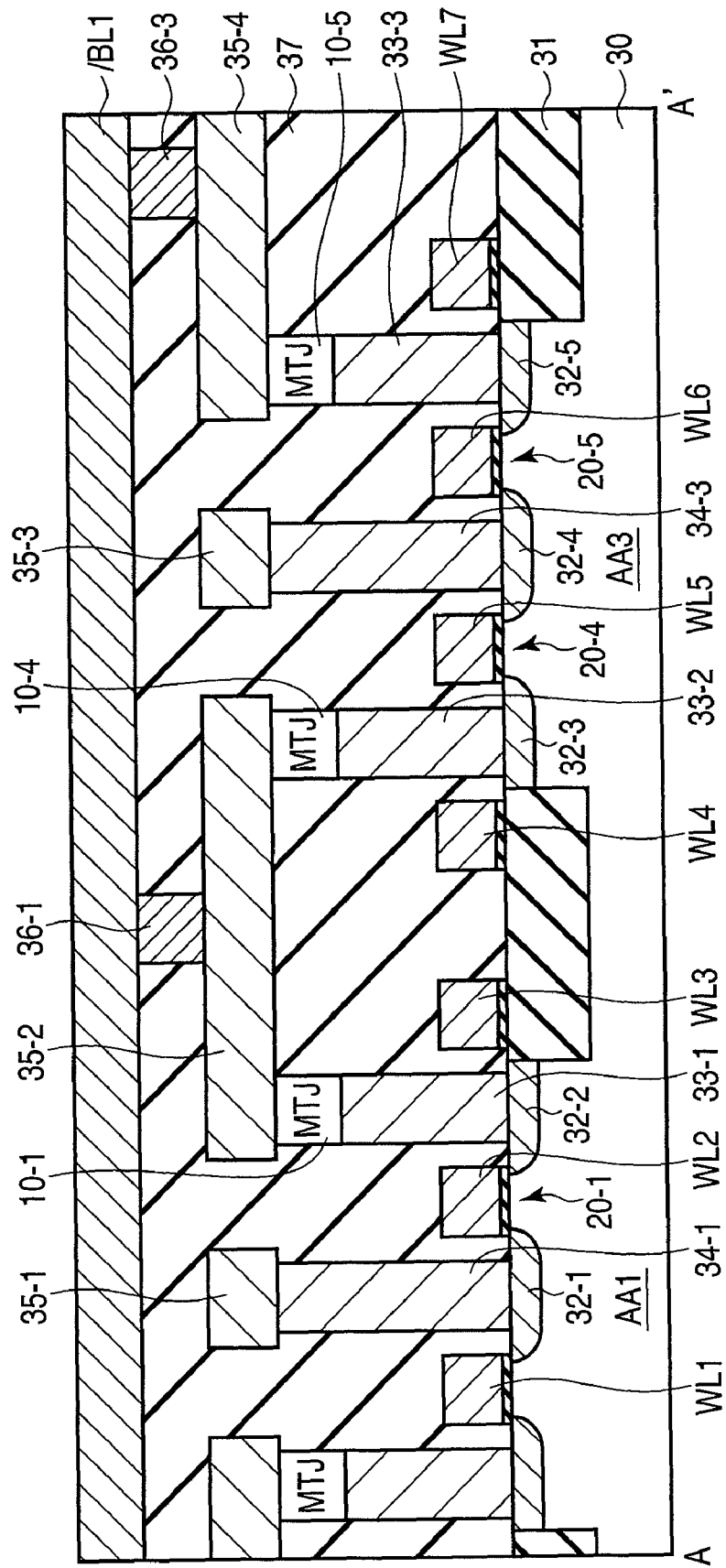
FIG. 5 is a sectional view of the MRAM cut along line A-A' of FIG. 4.
Figure 6:
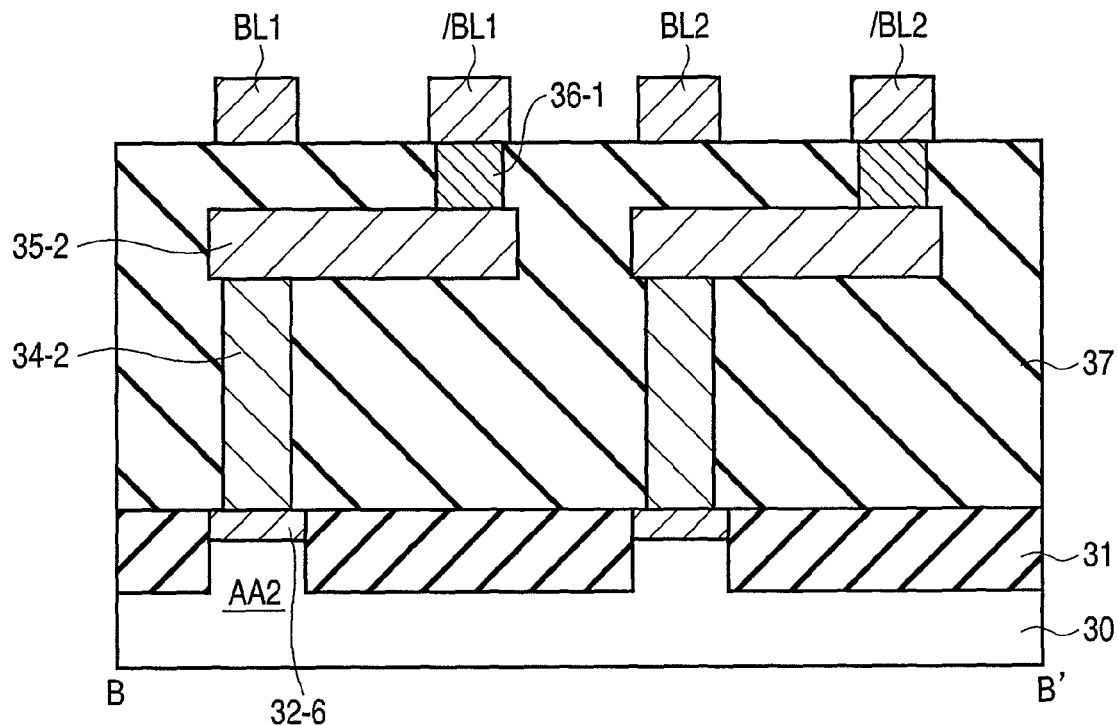
FIG. 6 is a sectional view of the MRAM cut along line B-B' of FIG. 4.

Next, the structure of the MRAM will be described. FIG. 4 is a layout diagram showing the structure of the MRAM according to the present embodiment. FIG. 5 is a sectional view of the MRAM cut along line A-A' of FIG. 4. FIG. 6 is a sectional view of the MRAM cut along line B-B' of FIG. 4.

A p-type conductive substrate 30 is, for example, a p-type semiconductor substrate, a semiconductor substrate having a p-type well, a silicon on insulator (SOI) type substrate having a p-type semiconductor layer or the like. As the semiconductor substrate 30, for example, silicon (Si) is used.

The semiconductor substrate 30 includes an element isolation insulating layer 31 in a surface region, and a surface region of the semiconductor substrate 30 which is not provided with the element isolation insulating layer 31 is an active area (element region) AA for forming elements. The element isolation insulating layer 31 is formed by means of, for example, shallow trench insulation (STI). As the material employed in the STI 31, for example, silicon oxide is used.

Above the semiconductor substrate 30, first bit lines BL1 and BL2 and second bit lines /BL1 and /BL2 are provided so that the lines are adjacent to each other with a predetermined space being left therebetween, and extend in an X-direction. The first bit lines BL1 and BL2 and second bit lines /BL1 and /BL2 are provided in the same level layer. The first bit lines BL and the second bit lines /BL are alternately arranged. It should be noted that the bit lines BL and /BL are formed as a second metal interconnect layer M2.

On the semiconductor substrate 30, seven gate electrodes are provided via a gate insulating film so that the electrodes are disposed adjacent to each other with a predetermined space being left therebetween, and extend in a Y-direction. These seven gate electrodes correspond to seven word lines WL1 to WL7.

In the semiconductor substrate 30 and under the bit line BL1, active areas AA2 and AA4 are provided. In the semiconductor substrate 30 and under the bit line /BL1, active areas AA1 and AA3 are provided. The planar shape of each active area AA is a rectangle. Moreover, the active area AA has such an X-direction length that two MOSFETs connected in series (i.e., sharing one source/drain region) can be formed, and has a width substantially equal to that of the bit line BL. In other words, the active area AA is formed to intersect with two word lines WL.

Moreover, for example, the active area AA2 is disposed to deviate as much as two word lines in the X-direction from the active area AA1 adjacent to the active area AA2 in the Y-direction. In other words, the active areas AA1 to AA4 are arranged in a zigzag manner.

As shown in FIG. 5, a MOSFET 20-1 disposed under the bit line /BL1 is constituted of two source/drain regions 32-1 and 32-2 formed in the active area AA1, and a gate electrode (word line WL1). A MOSFET 20-4 is constituted of two source/drain regions 32-3 and 32-4 formed in the active area AA3, and a gate electrode (word line WL5). A MOSFET 20-5 is constituted of two source/drain regions 32-4 and 32-5 formed in the active area AA3, and a gate electrode (word line WL6). That is, two MOSFETs 20 arranged adjacent to each other in the X-direction are connected in series so as to share one source/drain region 32. The constitutions of the MOSFETs disposed under the bit line BL1 are similar to those of the MOSFETs disposed under the bit line /BL1.

On the source/drain region 32-2 of the MOSFET 20-1, a contact 33-1 as a conductor consisting of a metal (e.g., tungsten [W]) or the like is provided, and on the contact 33-1, an MTJ element 10-1 is provided. On the source/drain region 32-3 of the MOSFET 20-4, a contact 33-2 is provided, and on the contact 33-2, an MTJ element 10-2 is provided. On the MTJ elements 10-1 and 10-2, an interconnect layer 35-2 as a conductor consisting of a metal (e.g., aluminum [Al]) or the like is provided. The interconnect layer 35 is formed as a first metal interconnect layer M1.

Here, each interconnect layer 35 has a T-shaped (or convex) planar shape. In other words, the interconnect layer 35 is constituted of a first interconnect portion 35A extending in the X-direction, and a second interconnect portion 35B protruding from the center of this first interconnect portion 35A in the Y-direction (extending toward the adjacent bit line).

The interconnect layer 35-2 will be described as an example. The first interconnect portion 35A of the interconnect layer 35-2 is provided on the MTJ elements 10-1 and 10-2, to electrically connect an upper electrode 15 of the MTJ element 10-1 to that of the MTJ element 10-2.

On a source/drain region 32-6 shared by MOSFETs 20-2 and 20-3, a contact 34-2 is provided, and on the contact 34-2, the interconnect layer 35-2 is provided. That is, the second interconnect portion 35B of the interconnect layer 35-2 extends in the Y-direction so as to be disposed under the bit line BL1, and reaches the contact 34-2. Thus, the interconnect layer 35-2 electrically connects the upper electrode of the MTJ element 10-1, the upper electrode of the MTJ element 10-2, the source/drain region of the MOSFET 20-2 and the source/drain region of the MOSFET 20-3, and therefore performs a function of the connection node N2 shown in the equivalent circuit diagram of FIG. 3.

On the interconnect layer 35-2, a contact 36-1 is provided, and on the contact 36-1, the bit line /BL1 is provided.

Two interconnect layers 35-2 and 35-3 adjacent to each other in the X-direction are formed such that the protruding directions of the second interconnect portions 35B are reversed. Moreover, a part of the first interconnect portion 35A of the interconnect layer 35-2 extending in the X-direction overlaps with a part of the first interconnect portion 35A of the interconnect layer 35-3 in the Y-direction, and the first interconnect portion 35A of one of the interconnect layers overlaps with the second interconnect portion 35B of the other interconnect layer in the X-direction. The constitution of the interconnect layer 35-3 is the same as that of the interconnect layer 35-2, except that a connecting relation between the bit lines BL1 and /BL1 is reversed. The constitution of another interconnect layer 35 is the same as that of the interconnect layer 35-2 or 35-3.

A space between the semiconductor substrate 30 and the bit line is filled with an interlayer insulating layer 37 made of, for example, silicon oxide.

[4. Write Operation of MRAM]

The path of a write current during the writing of a binary digit to the MTJ element 10 will be described.

For example, the writing of the binary digit to the MTJ element 10-4 will be described as an example. First, the word line WL5 is activated, and the MOSFET 20-4 turns on. At this time, the upper electrode 15 of the MTJ element 10-4 is electrically connected to the bit line /BL1 via the interconnect layer 35-2 and the contact 36-1. Moreover, the lower electrode 11 of the MTJ element 10-4 is electrically connected to the bit line BL1 via the contact 33-2, the MOSFET 20-4, a contact 34-3, the interconnect layer 35-3 and a contact 36-2. In consequence, both terminals of the MTJ element 10-4 are electrically connected to the bit lines BL1 and /BL1, respectively, and hence the write current can be bidirectionally supplied to the MTJ element 10-4 by means of the bit lines BL1 and /BL1.

Another example will be described. To write the binary digit to the MTJ element 10-3, first the word line WL4 is activated, and the MOSFET 20-3 turns on. At this time, the upper electrode 15 of the MTJ element 10-3 is electrically connected to the bit line BL1 via the interconnect layer 35-3 and the contact 36-2. Moreover, the lower electrode 11 of the MTJ element 10-3 is electrically connected to the bit line /BL1 via the MOSFET 20-3, the contact 34-2, the interconnect layer 35-2 and the contact 36-1. In consequence, both terminals of the MTJ element 10-3 are electrically connected to the bit lines BL1 and /BL1, respectively, and hence the write current can be bidirectionally supplied to the MTJ element 10-3 by means of the bit lines BL1 and /BL1.

As described above in detail, in the present embodiment, in the same level layer above the semiconductor substrate, the first bit line BL and the second bit line /BL extending in the X-direction are provided adjacent to each other. Moreover, under the first bit line BL, a first MTJ element and a first MOSFET connected in series are provided, and under the second bit line /BL, a second MTJ element and a second MOSFET connected in series are provided. Then, a first interconnect layer for electrically connecting one terminal of the first MTJ element and one terminal of the second MOSFET to the first bit line BL and a second interconnect layer for electrically connecting one terminal of the second MTJ element and one terminal of the first MOSFET to the second bit line /BL are newly provided.

Therefore, according to the present embodiment, the following effect is obtained.

For example, when the active area of the MOSFET is electrically connected to the bit line by using a technique for extending the lower electrode of the MTJ element, the lower electrode of the MTJ element has a film thickness smaller than that of a usual metal wire, and hence has a high sheet resistance. Therefore, the parasitic resistance of the MTJ element increases, and the signal ratio of the MTJ element deteriorates, which results in a reduced read margin. Moreover, when the active area of the MOSFET is electrically connected to the bit line by using a technique for extending the active area of the MOSFET, the active area has a high sheet resistance, and hence the parasitic resistance of the MTJ element increases. In consequence, the signal ratio of the MTJ element deteriorates, and a reduced read margin results.

However, in the present embodiment, by using the interconnect layer 35 consisting of, for example, a metal, the active area AA of the MOSFET 20 is electrically connected to the bit line BL. In consequence, the parasitic resistance of the MTJ element 10 can be reduced while reducing the area of each memory cell (without increasing the area of the memory cell), and the reduction of the read margin can be suppressed.

Moreover, heretofore, the pair of bit lines connected to both ends of the memory cell MC have employed different interconnect layers. Therefore, as the interconnect layers required for constituting the memory cell MC, at least two layers for the pair of bit lines are necessary. On the other hand, in the present embodiment, the pair of bit lines connected to both ends of the memory cell MC both employ the same interconnect layer. Therefore, one interconnect layer for the bit line can be removed. In consequence, production cost and chip preparation time can be reduced without increasing the area of the memory cell. Such a cell size of the present embodiment is $8F^2$ (F is a minimum feature size).

EXAMPLES

As described above, various memories other than an MRAM can be used as a resistance-change memory of the present invention. Hereinafter, as the other examples of the resistance-change memory, an ReRAM and a PRAM will be described.

(ReRAM)

Figures 7, 8:
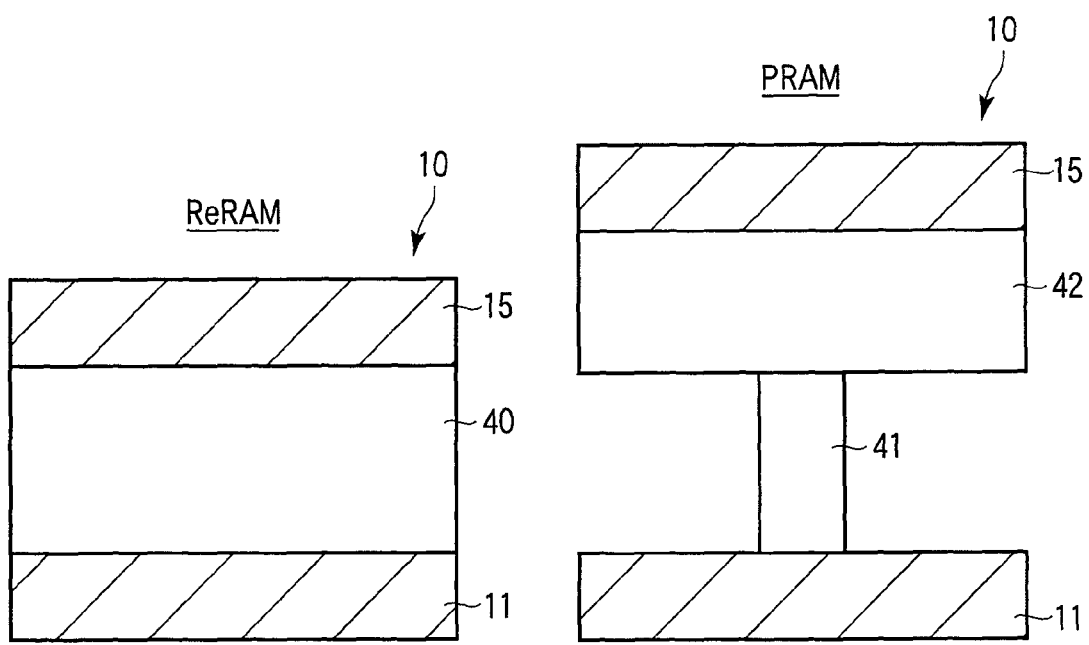
FIG. 7 is a schematic diagram showing the constitution of a variable-resistance element 10 used in an ReRAM according to an example.
FIG. 8 is a schematic diagram showing the constitution of the variable-resistance element 10 used in a PRAM according to another example.

FIG. 7 is a schematic diagram showing a constitution of a variable-resistance element 10 used in an ReRAM. The variable-resistance element 10 includes a lower electrode 11, an upper electrode 15 and a recording layer 40 sandwiched between these electrodes.

The recording layer 40 consists of a transition metal oxide such as a perovskite or binary metal oxide. Examples of a perovskite metal oxide include PCMO($Pr_{0.7}Ca_{0.3}MnO_3$), Nb-added SrTi(Zr)$O_3$ and Cr-added SrTi(Zr)$O_3$. Examples of a binary metal oxide include NiO, $TiO_2$ and $Cu_2O$.

The variable-resistance element 10 has a resistance which changes when the polarity of a voltage applied thereto is changed (bipolar type) or a resistance which changes when the absolute value of the voltage applied thereto is changed (unipolar type). Therefore, the variable-resistance element 10 is set to a low-resistance state or a high-resistance state, by controlling the applied voltage. It should be noted that it is judged whether the element is of the bipolar or unipolar type, depending on the selected material of the recording layer 40.

In a case where the variable-resistance element 10 is of, for example, the bipolar type, a voltage to change the variable-resistance element 10 from the high-resistance state (a reset state) to the low-resistance state (a set state) is a set voltage Vset and a voltage to change the element from the low-resistance state (set state) to the high-resistance state (reset state) is a reset voltage Vreset, the set voltage Vset is set to a positive bias for applying a positive voltage to the upper electrode 15 with respect to the lower electrode 11, and the reset voltage Vreset is set to a negative bias for applying a negative voltage to the upper electrode 15 with respect to the lower electrode 11. Moreover, the low- and the high-resistance states correspond respectively to binary 0 and 1, whereby the variable-resistance element 10 can store one binary digit.

To read the binary digit, a sufficiently small read voltage which is about 1/1000 to 1/4 of the reset voltage Vreset is applied to the variable-resistance element 10. Then, at this time, a current flowing through the variable-resistance element 10 can be detected to read the binary digit.

(PRAM)

FIG. 8 is a schematic diagram showing a constitution of a variable-resistance element 10 used in a PRAM. The variable-resistance element 10 has a constitution in which a lower electrode 11, a heater layer 41, a recording layer 42 and an upper electrode 15 are laminated in that order.

The recording layer 42 consists of a phase-change material which adopts a crystalline state or an amorphous state by heat generated during writing. Examples of a material of the recording layer 42 include chalcogen compounds such as Ge—Sb—Te, In—Sb—Te, Ag—In—Sb—Te and Ge—Sn—Te. These materials preferably secure high-speed switching properties, repetitive recording stability and high reliability.

The heater layer 41 comes in contact with the bottom surface of the recording layer 42. The area of the heater layer 41 which comes in contact with the recording layer 42 is preferably smaller than that of the bottom surface of the recording layer 42. Thus, a contact portion between the heater layer 41 and the recording layer 42 is made smaller to miniaturize a heating portion, thereby reducing a write current or voltage. The heater layer 41 consists of a conductive material, and preferably consists of, for example, one material selected from the group comprising TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W and Cu. Moreover, the heater layer 41 may consist of the same material as that of the lower electrode 11 described later.

The area of the lower electrode 11 is larger than that of the heater layer 41. The upper electrode 15 has, for example, the same planar shape as that of the recording layer 42. Examples of the material of the lower electrode 11 and the upper electrode 15 include high melting point metals such as Ta, Mo and W.

As to the recording layer 42, the size and width of a current pulse applied thereto are controlled to change the heating temperature of the layer, and the layer changes to the crystalline state or the amorphous state. Specifically, during writing, a voltage or a current is applied between the lower electrode 11 and the upper electrode 15, and the current is supplied from the upper electrode 15 to the lower electrode 11 through the recording layer 42 and the heater layer 41. When the recording layer 42 is heated to the vicinity of a melting point, the recording layer 42 changes to an amorphous (high-resistance) phase, and keeps the amorphous state even when the applying of the voltage or the current is stopped.

On the other hand, when the voltage or the current is applied between the lower electrode 11 and the upper electrode 15 and the recording layer 42 is heated to the vicinity of a temperature suitable for crystallizing the recording layer 42, the recording layer 42 changes to a crystal phase (low-resistance phase), and keeps the crystalline state even when the applying of the voltage or the current is stopped. When the recording layer 42 is changed to the crystalline state, the size of the current pulse applied to the recording layer 42 is set to a small size, and the width of the current pulse is set to a large width as compared with a case where the recording layer is changed to the amorphous state. Thus, when the voltage or the current is applied between the lower electrode 11 and the upper electrode 15 to heat the recording layer 42, the resistance of the recording layer 42 can be changed.

It can be judged whether the recording layer 42 has the crystal phase or an amorphous phase, by applying a low voltage or a low current between the lower electrode 11 and the upper electrode 15 to such an extent that the recording layer 42 does not change to the crystalline state or the amorphous state and reading the voltage or the current between the lower electrode 11 and the upper electrode 15. Therefore, when the low- and high-resistance states correspond respectively to binary 0 and 1, one binary digit can be read from the variable-resistance element 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first bit line and a second bit line provided in the same level layer above a semiconductor substrate, and extending in a first direction so as to be adjacent to each other;
   a first MOSFET provided on the semiconductor substrate and disposed under the first bit line;
   a second MOSFET provided on the semiconductor substrate and disposed under the second bit line;
   a first variable-resistance element disposed under the first bit line, comprising one terminal electrically connected to one end of a current path of the first MOSFET, and comprising a resistance which changes according to stored data;
   a substantially vertical first contact configured to electrically connect the one terminal of the first variable-resistance element to the one end of the current path of the first MOSFET, wherein the first variable-resistance element is provided directly on one end of the first contact and a source or drain region of the first MOSFET is provided directly on another end of the first contact;
a second variable-resistance element disposed under the second bit line and comprising one terminal electrically connected to one end of a current path of the second MOSFET;
a substantially vertical second contact configured to electrically connect the one terminal of the second variable-resistance element to the one end of the current path of the second MOSFET, wherein the second variable-resistance element is provided directly on one end of the second contact and a source or drain region of the second MOSFET is provided directly on another end of the second contact; and
a first interconnect layer provided on the first variable-resistance element, configured to electrically connect the first bit line to another terminal of the first variable-resistance element, and configured to electrically connect the first bit line to another end of the current path of the second MOSFET.

2. The device of claim 1, further comprising:
a third MOSFET provided on the semiconductor substrate and disposed under the first bit line; and
a third variable-resistance element disposed under the first bit line and comprising one terminal electrically connected to one end of a current path of the third MOSFET,
the first interconnect layer configured to electrically connect the first bit line and another terminal of the third variable-resistance element.

3. The device of claim 2, wherein the first interconnect layer comprises:
a first interconnect portion extending in the first direction and configured to electrically connect the first bit line to other terminals of the first and third variable-resistance elements; and
a second interconnect portion extending from the first interconnect portion toward the second bit line and configured to electrically connect the first bit line to said another end of the current path of the second MOSFET.

4. The device of claim 3, wherein:
the first variable-resistance element is provided at a first end of the first interconnect portion; and
the third variable-resistance element is provided at a second end of the first interconnect portion.

5. The device of claim 1, wherein the first interconnect layer comprises a T-shaped planar shape.

6. The device of claim 1, further comprising:
a second interconnect layer provided on the second variable-resistance element, configured to electrically connect the second bit line to another terminal of the second variable-resistance element, and configured to electrically connect the second bit line to another end of the current path of the first MOSFET.

7. The device of claim 6, further comprising:
a fourth MOSFET provided on the semiconductor substrate and disposed under the second bit line; and
a fourth variable-resistance element disposed under the second bit line and comprising one terminal electrically connected to one end of a current path of the fourth MOSFET,
the second interconnect layer configured to electrically connect the second bit line and another terminal of the fourth variable-resistance element.

8. The device of claim 7, wherein the second interconnect layer comprises:
a third interconnect portion extending in the first direction and configured to electrically connect the second bit line to other terminals of the second and fourth variable-resistance elements; and a fourth interconnect portion extending from the third interconnect portion toward the first bit line and configured to electrically connect the second bit line to said another end of the current path of the first MOSFET.

9. The device of claim 8, wherein:
the second variable-resistance element is provided at a first end of the third interconnect portion; and
the fourth variable-resistance element is provided at a second end of the third interconnect portion.

10. The device of claim 6, wherein the second interconnect layer comprises a T-shaped planar shape.

11. The device of claim 1, wherein the first variable-resistance element and the second variable-resistance element are opposed to each other in a second direction perpendicular to the first direction.

12. The device of claim 1, wherein:
the first MOSFET comprises a first gate electrode extending in a second direction perpendicular to the first direction and provided on the semiconductor substrate via a gate insulating film;
the second MOSFET comprises a second gate electrode extending in the second direction and provided on the semiconductor substrate via a gate insulating film; and
the first and second variable-resistance elements are provided between the first and second gate electrodes.

13. The device of claim 1, further comprising:
a third contact configured to electrically connect the first interconnect layer to the first bit line; and
a fourth contact configured to electrically connect the first interconnect layer to said another end of the current path of the second MOSFET.

14. The device of claim 6, further comprising:
a third contact configured to electrically connect the second interconnect layer to the second bit line; and
a fourth contact configured to electrically connect the second interconnect layer to said another end of the current path of the first MOSFET.

15. The device of claim 1, further comprising:
a first active area provided in the semiconductor substrate, disposed under the first bit line, and extending in the first direction; and
a second active area provided in the semiconductor substrate, disposed under the second bit line, and extending in the first direction,
wherein the first MOSFET is provided on the first active area, and
the second MOSFET is provided on the second active area.

16. The device of claim 15, wherein:
the first active area is shared by a fifth MOSFET which is adjacent to the first MOSFET and opposite the first variable-resistance element; and
the second active area is shared by a sixth MOSFET which is adjacent to the second MOSFET and opposite the second variable-resistance element.

17. The device of claim 15, wherein the first active area and the second active area comprise a rectangular planar shape.

18. The device of claim 1, wherein each of the variable-resistance elements comprises:
a fixed layer comprising a fixed direction of magnetization;
a recording layer comprising a variable direction of magnetization; and
a nonmagnetic layer sandwiched between the fixed layer and the recording layer.

* * * * *